United States Patent [19]

Rodgers

[11] 4,170,667

[45] Oct. 9, 1979

[54] PROCESS FOR MANUFACTURING PURE POLYCRYSTALLINE SILICON

[75] Inventor: Michael A. Rodgers, Tempe, Ariz.

[73] Assignee: Motorola, Inc., Schaumburg, Ill.

[21] Appl. No.: 899,125

[22] Filed: Apr. 24, 1978

Related U.S. Application Data

[63] Continuation of Ser. No. 763,952, Jan. 31, 1977, abandoned.

[51] Int. Cl.² .................... C01B 33/00; C01B 33/02
[52] U.S. Cl. ............................... 427/86; 423/349; 423/350; 427/95; 427/248 R; 427/248 B
[58] Field of Search .............. 427/95, 248 R, 255, 427/248 B, 86; 423/342, 349, 350; 118/48

[56] References Cited

U.S. PATENT DOCUMENTS

| | | | |
|---|---|---|---|
| 3,540,871 | 11/1970 | Dyer | 427/95 |
| 3,734,770 | 5/1973 | Price et al. | 427/95 |
| 3,865,647 | 2/1975 | Reuschel | 423/350 |
| 3,900,660 | 8/1975 | Bradley | 423/350 |
| 3,933,985 | 1/1976 | Rogers | 423/350 |
| 3,963,838 | 6/1976 | Setty et al. | 423/350 |

*Primary Examiner*—John D. Smith
*Attorney, Agent, or Firm*—John A. Fisher

[57] ABSTRACT

A process for the production of high purity polycrystalline silicon from a mixture of silicon tetrachloride and trichlorosilane. Such a mixture can be used for the rapid deposition of polycrystalline silicon while, at the same time, producing an excess of trichlorosilane in exhaust gases from the reaction. The process permits the modification of the reactor design for the economical and energy conscious production of polycrystalline silicon.

3 Claims, 3 Drawing Figures

PROCESS FOR MANUFACTURING PURE POLYCRYSTALLINE SILICON

This is a continuation, of application Ser. No. 763,952, filed Jan. 31, 1977 now abandoned.

BACKGROUND OF THE INVENTION

This invention relates to a process for the production of semiconductor grade polycrystalline silicon and more particularly to a cost efficient process for producing polycrystalline silicon using trichlorosilane and silicon tetrachloride.

In the semiconductor industry relatively large quantities of high quality monocrystalline silicon are required for the production of semiconductor devices and integrated circuits. One of the most common methods used in the growth of monocrystalline silicon is the Czochralski method in which extremely pure polycrystalline silicon is converted to monocrystalline silicon. In the conversion process, controlled amounts of dopant materials are added to the polycrystalline silicon to produce monocrystalline silicon of the desired resistivity.

The extremely pure polycrystalline silicon can be produced by the hydrogen reduction of $SiHCl_3$ at a temperature of about 1100° C. Hydrogen and $SiHCl_3$ are introduced into a reaction chamber and polycrystalline silicon produced by the reaction is deposited in rod form on a heated filament. The reaction as commonly used is very incomplete. The exhaust gases from the reaction chamber contain large quantities of unreacted $SiHCl_3$ and $H_2$ as well as HCl and $SiCl_4$. Thus only a portion of the $SiHCl_3$ source is converted to silicon while part is unreacted and part is converted to HCl and $SiCl_4$. The exhaust gases can be separated to remove the $SiHCl_3$ and $H_2$ which are returned to the reaction chamber. The $SiCl_4$ is essentially a waste product, except that some portion of it can be used in epitaxial deposition systems and some can be converted back to $SiHCl_3$ (Rodgers U.S. Pat. No. 3,933,985). The $SiCl_4$ has not been used directly in the polycrystalline production process because the production of silicon from $SiCl_4$ is too slow to be economical.

As commonly practiced, the production of polycrystalline silicon is an expensive process because of the large amounts of pure $SiHCl_3$ and hydrogen that are used. This is aggravated by the imcompleteness of the reduction reaction. Although part of the unreacted components can be purified and reused, that portion of the $SiHCl_3$ which is converted to $SiCl_4$ is either wasted or must be converted back to $SiHCl_3$ for use.

The polycrystalline silicon production process is also expensive from the standpoint of energy usage. Much energy is radiated from the conventional silicon reactor because the reaction is relatively uninsulated. The lack of insulation is necessitated by the large temperature gradient required from the silicon rod to the reactor wall. The gradient is necessary to keep the rod hot enough for the rapid deposition of dense silicon while keeping the wall cool enough to prevent deposition thereon. Deposition of silicon on the quartz walls of the reactor would lead to devitrification of the quartz and consequently to a short useful life for the quartz. In contrast, Pauls (U.S. Pat. No. 2,943,918) teaches the deposition of the polycrystalline silicon directly on the walls of the quartz reaction chamber instead of deposition on a heated filament. Recovery of the polycrystalline silicon then requires the breaking away of the quartz to free the polycrystalline silicon.

Accordingly, in view of the large amount of silicon required in the semiconductor industry, and further in view of the present emphasis on the conservation of energy, a need existed for an efficient, economical process for the production of high purity polycrystalline silicon.

SUMMARY OF THE INVENTION

It is an object of this invention to provide a process for the production of high purity polycrystalline silicon.

It is a further object of this invention to provide a process for the production of polycrystalline silicon from a mixture of $SiHCl_3$ and $SiCl_4$.

It is a still further object of this invention to provide a process for the economical and energy conscious production of polycrystalline silicon.

If a given mole ratio of $SiHCl_3$ in hydrogen is introduced into a polycrystalline silicon reactor, there is a certain potential for deposition of silicon on a heated filament within the reactor. Increasing the mole ratio of $SiHCl_3$ above that initial ratio value increases the potential for deposition of silicon. In contrast, replacing some of the $SiHCl_3$ in the gas stream with $SiCl_4$ reduces the potential for deposition. Thus the additions of $SiHCl_3$ and $SiCl_4$ have opposite effects regarding the amount of polycrystalline silicon deposited.

By introducing $SiCl_4$ into the reactor and simultaneously increasing the mole ratio of $SiHCl_3$ above the initial mole ratio the deposition rate of polycrystalline silicon can be maintained constant. It has been discovered that by so doing an excess amount of $SiHCl_3$ is present in the exhaust gases from the reactor. Thus some portion of the $SiCl_4$ is converted to $SiHCl_3$ in the reaction process. Thus by combining $SiCl_4$ which is normally a waste product with $SiHCl_3$ in the feed mixture, the deposition rate of silicon can be maintained while $SiHCl_3$ is being produced.

It is well known that at high temperatures and in sufficiently high concentrations, $SiCl_4$ in $H_2$ is a silicon etchant. This property can be used with the feed mixture consisting of $SiCl_4$ plus $SiHCl_3$ to inhibit or eliminate the potential to deposit silicon on the reactor walls even though the walls may be as hot or hotter than the deposition filament or rod. Rather than mixing the $SiCl_4$ and $SiHCl_3$ outside the reactor, the $SiHCl_3$ can be fed in near the center of the reactor and the $SiCl_4$ fed in near the reactor walls. The $SiCl_4$ first prevents deposition of silicon on the reactor walls and then mixes within the reactor with the $SiHCl_3$ to provide the proper feed mixture. Because the potential for deposition on the reactor walls is reduced by the $SiCl_4$, the walls need not be at a low temperature and the reactor can be insulated to reduce radiative energy losses.

DETAILED DESCRIPTION

A polycrystalline silicon reactor fed with $x_0$ mole percent of trichlorosilane in hydrogen has a certain potential to deposit silicon on a heated filament within the reactor. The addition of y mole percent of silicon tetrachloride in the feed mixture will reduce the potential for silicon deposition. To maintain the original potential for deposition in the presence of the SiCl4, an additional amount $x_1$ of SiHCl3 must be added to the feed mixture. Thus the feed mixture entering the reactor will consist of y mole percent of SiCl4 and x mole percent of SiHCl3 in hydrogen, where $x = x_0 + x_1$. The exhaust gases exiting from the reactor will contain z mole percent of SiHCl3 in addition to some quantities of hydrogen, hydrogen chloride, and silicon tetrachloride. The amount of SiHCl3 in the exhaust will vary according to the approximate expression $$z = z_0 + z_1 + x_1$$

This expression is only approximate because of the change in reaction volume from input to exhaust. In this expression $z_0$ is the mole percent of SiHCl3 in the exhaust when $y = 0$ and $x = x_0$. The excess SiHCl3 in the exhaust is given by $z_1$. Thus excess SiHCl3 results from the conversion of some of the input SiCl4 to SiHCl3. When the concentration, y, of SiCl4 gets too high, $z_1$ becomes negative and the reactor uses up SiHCl3 rather than producing it. A point exists between $y = 0$ and the point where $z_1$ becomes negative at which $z_1$ is maximized. This is the optimum point to operate the reactor because the maximum amount of SiCl4 is being converted to SiHCl3 while still giving high rates of silicon deposition.

Figure 1:
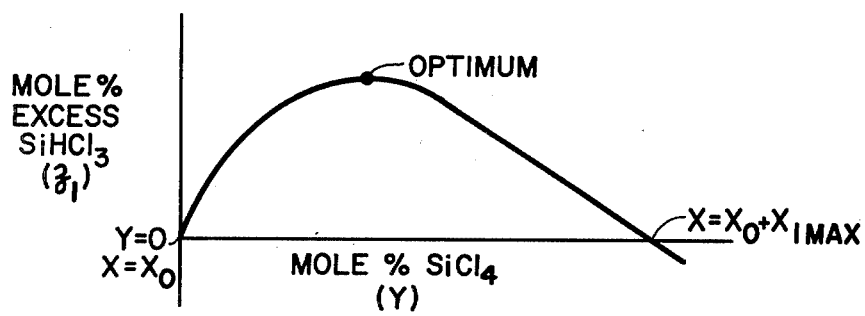
FIG. 1 is a graph showing the excess trichlorosilane produced as a function of the mole percent of silicon tetrachloride in the feed mixture.

FIG. 1 illustrates this relationship between the mole percent SiCl4 in the feed mixture and the resulting excess SiHCl3 produced. The amount of excess SiHCl3 is zero for the case of no added SiCl4, increases as the amount of SiCl4 in the feed mixture is increased, and reaches a maximum for some particular mole ratio of SiCl4. Further increasing the amount of SiCl4 in the feed mixture causes the amount of excess SiHCl3 in the exhaust to decrease and eventually to become negative. At the point designated $y = y_{max}$ the SiHCl3 in the exhaust is equal to $x_0 + x_{1\ max}$ and the excess SiHCl3 is zero.

It has been found, for example, that a feed mixture consisting of 8 mole percent trichlorosilane and 12 mole percent of silicon tetrachloride in hydrogen produces a silicon deposition approximately equivalent to 6.5 mole percent of trichlorosilane in hydrogen at a deposition temperature of 1090° C. The exhaust gases from the reaction contain approximately 1.6 mole percent of excess trichlorosilane.

Further, at a deposition temperature of 1100° C. it has been found that a feed mixture consisting of 7 mole percent of trichlorosilane and 10 mole percent of silicon tetrachloride produces a silicon deposition approximately equivalent to 6 mole percent of trichlorosilane with no silicon tetrachloride. The exhaust gases from the reactor contain approximately 1.7 mole percent of excess trichlorosilane.

The following nonlimiting examples are calculations which describe the invention further and represent preferred modes for the practice of the invention.

The following are mixtures of SiHCl3 and SiCl4 which give silicon depositions equivalent to a feed of 6.5 mole percent SiHCl3 in hydrogen with no SiCl4.

| | Deposition Temperature, 1090° C. | | | |
|---|---|---|---|---|
| Example | Mole % SiHCl3 feed | Mole % SiCl4 feed | Mole % Total feed | Mole % Excess SiHCl3 in Exhaust |
| 1 | 6.50 | 0 | 6.50 | 0 |
| 2 | 6.60 | 4.40 | 11.00 | 1.109 |
| 3 | 6.98 | 6.98 | 13.95 | 1.425 |
| 4 | 8.00 | 12.00 | 19.99 | 1.651 |
| 5 | 8.09 | 12.38 | 20.47 | 1.653 |
| 6 | 8.12 | 12.55 | 20.67 | 1.654 |
| 7 | 8.14 | 12.63 | 20.77 | 1.654 |
| 8 | 8.16 | 12.71 | 20.87 | 1.654 |
| 9 | 8.18 | 12.79 | 20.97 | 1.653 |
| 10 | 8.39 | 13.68 | 22.07 | 1.647 |
| 11 | 8.89 | 15.81 | 24.70 | 1.599 |
| 12 | 9.57 | 18.58 | 28.15 | 1.477 |
| 13 | 10.50 | 22.31 | 32.80 | 1.255 |

The following are mixtures of SiHCl3 and SiCl4 which give silicon depositions equivalent to a feed of 6.0 mole percent SiHCl3 in hydrogen with no SiCl4. The deposition temperature is the same as in Examples 1–13.

| | Deposition Temperature 1090° C. | | | |
|---|---|---|---|---|
| Ex. | Mole % SiHCl3 feed | Mole % SiCl4 feed | Mole % Total feed | Mole % Excess SiHCl3 in Exhaust |
| 14 | 6.00 | 0 | 6.00 | 0 |
| 15 | 7.05 | 10.57 | 17.61 | 1.771 |
| 16 | 7.36 | 12.01 | 19.37 | 1.802 |
| 17 | 7.55 | 12.86 | 20.41 | 1.808 |
| 18 | 7.57 | 12.95 | 20.52 | 1.808 |
| 19 | 7.59 | 13.04 | 20.64 | 1.808 |
| 20 | 7.62 | 13.14 | 20.75 | 1.808 |
| 21 | 7.77 | 13.82 | 21.60 | 1.805 |
| 22 | 8.03 | 14.92 | 22.95 | 1.788 |
| 23 | 8.06 | 15.04 | 23.10 | 1.786 |

The following are mixtures of SiHCl3 and SiCl4 which give a silicon deposition equivalent to a feed of 6.0 mole percent SiHCl3 in hydrogen with no SiCl4. The deposition temperature has been changed to 1100° C.

| | Deposition Temperature 1100° C. | | | |
|---|---|---|---|---|
| Ex. | Mole % SiHCl3 feed | Mole % SiCl4 feed | Mole % Total Feed | Mole % Excess SiHCl3 in Exhaust |
| 24 | 6.00 | 0 | 6.00 | 0 |
| 25 | 7.03 | 10.55 | 17.58 | 1.757 |
| 26 | 7.19 | 11.24 | 18.43 | 1.771 |
| 27 | 7.36 | 12.01 | 19.38 | 1.779 |
| 28 | 7.42 | 12.26 | 19.68 | 1.779 |
| 29 | 7.44 | 12.35 | 19.79 | 1.779 |
| 30 | 7.46 | 12.44 | 19.90 | 1.779 |
| 31 | 7.57 | 12.89 | 20.45 | 1.778 |
| 32 | 8.09 | 15.02 | 23.10 | 1.736 |

The following are optimum mixtures of SiHCl3 and SiCl4 for depositions of silicon at 1090° C. The mixtures are equivalent to the mole ratios of SiHCl3 in hydrogen from 5.0 mole percent to 8.0 mole percent as indicated.

| | Optimum Mixtures Deposition Temperature 1090° C. | | | |
|---|---|---|---|---|
| Ex. | Equivalent feed, mole % SiHCl₃ (no SiCl₄) | Mole % SiHCl₃ feed | Mole % SiCl₄ feed | Mole % Total feed | Mole % Excess SiHCl₃ in Exhaust |
| 33 | 5.0 | 6.43 | 13.86 | 20.30 | 2.174 |
| 34 | 5.5 | 7.03 | 13.46 | 20.49 | 1.981 |
| 35 | 6.0 | 7.57 | 12.95 | 20.52 | 1.808 |
| 36 | 6.5 | 8.14 | 12.63 | 20.77 | 1.654 |
| 37 | 7.0 | 8.68 | 12.23 | 20.90 | 1.514 |
| 38 | 7.5 | 9.20 | 11.85 | 21.06 | 1.387 |
| 39 | 8.0 | 9.72 | 11.50 | 21.22 | 1.272 |

As can be seen from an examination of the above examples, optimum results are obtained from a mixture containing between 7.0 and 8.2 mole percent trichlorosilane and between about 12 to 13 mole percent silicon tetrachloride in hydrogen. The mole percent of excess trichlorosilane in the exhaust tends to decrease for mixtures containing either higher or lower percentages than indicated.

Figure 2:
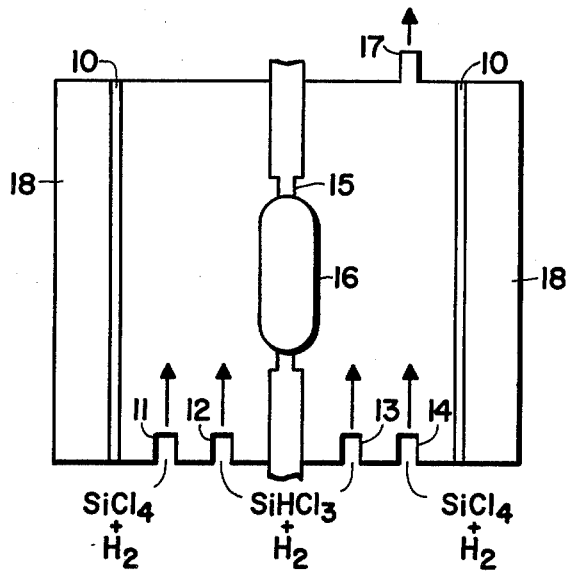
FIG. 2 schematically depicts a reactor design modification made possible by the invention.

FIG. 2 schematically depicts a reactor design that can be used in accordance with the present invention. The reactor consists of a quartz enclosure 10 into which the feed mixture can be introduced through inlets 11–14. Heat is supplied to the reactor by passing a current through filament 15 upon which pure polycrystalline silicon 16 is deposited. Exhaust gases exit the reactor through outlet 17. Insulation 18 reduces radiative heat losses from the reactor. Deleterious deposition of silicon on the quartz reactor walls 10 is prevented by introducing the SiCl₄ portion of the feed mixture plus hydrogen through inlets 11 and 14 so that the SiCl₄ plus hydrogen is in close proximity to the quartz walls 10. At high temperatures the SiCl₄ plus hydrogen provides a continuous etching of any silicon which might otherwise deposit on the quartz walls 10. The SiHCl₃ plus hydrogen portion of the feed mixture is introduced into the reactor through inlets 12 and 13 near the center of the reactor. The required mixing of the SiCl₄ and SiHCl₃ takes place within the reactor to provide the desired feed mixture.

Figure 3:
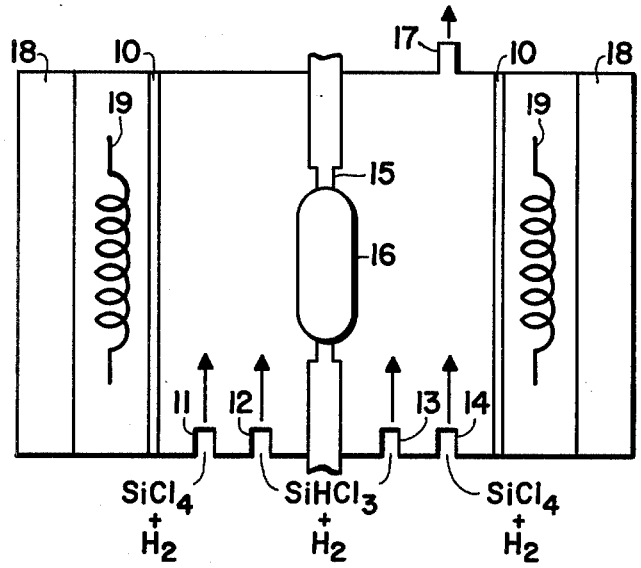
FIG. 3 schematically depicts a further reactor design modification made possible by the invention.

FIG. 3 depicts a further modification in reactor design that can be used in accordance with the present invention. The same elements are given the same numerical designation as in FIG. 2. Because the need for cooled reactor walls to prevent silicon deposition thereon has been obviated, external heating means can be employed to obtain the required deposition temperature. Accordingly, external heating elements 19 are provided between the quartz enclosure 10 and the insulation 18. The use of external heating elements 19 eliminates the problems commonly attendant with internal heating by means of filament 15. Filament 15 is now used only as surface upon which the silicon is deposited.

It should now be apparent that a process for producing pure polycrystalline silicon in accordance with the stated objectives of the invention has been provided. Through the utilization of a mixture of trichlorosilane and silicon tetrachloride a method has been provided for producing pure silicon and for producing an excess amount of trichlorosilane. In addition, the process can be employed with a modified reactor design to conserve energy through the reduction in radiative heat losses.

While the above examples represent the best modes contemplated for carrying out the invention, it should be apparent to one skilled in the art that various changes in the process may be made. For example, while FIGS. 2 and 3 have depicted a straight through reactor, a bell jar or other reactor configuration could equally well be used.

What is claimed is:

1. A process for producing pure semiconductor grade polycrystalline silicon in a reaction chamber having insulated walls comprising the steps of: introducing about 7 to 8.2 mole percent trichlorosilane in hydrogen into said reaction chamber through inlets located near the center of said chamber; introducing about 12 to 13 mole percent silicon tetrachloride in hydrogen into said reaction chamber through inlets located in close proximity to said insulated walls of said reaction chamber; mixing said silicon tetrachloride and trichlorosilane in hydrogen within said reaction chamber; reacting said mixture of silicon tetrachloride and trichlorosilane in hydrogen at a temperature between 900° C. and 1200° C. to form silicon; and depositing said silicon on a filament within said reaction chamber.

2. The process of claim 1 wherein said reaction chamber is heated by heater elements located outside said reaction chamber.

3. The process of claim 1 wherein the temperature is approximately 1090° C. to 1100° C.

* * * * *